US007190105B2

(12) United States Patent
Deserno et al.

(10) Patent No.: US 7,190,105 B2
(45) Date of Patent: Mar. 13, 2007

(54) SOUND OR ULTRASOUND SENSOR

(75) Inventors: Rolf Deserno, Maulburg (DE); Helmut Pfeiffer, Steinen (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 0 days.

(21) Appl. No.: 10/509,685

(22) PCT Filed: Apr. 9, 2003

(86) PCT No.: PCT/EP03/03682

§ 371 (c)(1),
(2), (4) Date: Jul. 13, 2005

(87) PCT Pub. No.: WO03/086011

PCT Pub. Date: Oct. 16, 2003

(65) Prior Publication Data

US 2006/0076854 A1 Apr. 13, 2006

(30) Foreign Application Priority Data

Apr. 11, 2002 (DE) ................................ 102 16 037

(51) Int. Cl.
*H01L 41/08* (2006.01)

(52) U.S. Cl. ....................... 310/322; 310/326; 310/327

(58) Field of Classification Search ................ 310/344, 310/322, 326, 327, 334–336
See application file for complete search history.

(56) References Cited

U.S. PATENT DOCUMENTS

| | | | | |
|---|---|---|---|---|
| 3,921,442 | A * | 11/1975 | Soloway | 73/644 |
| 3,950,660 | A * | 4/1976 | McElroy | 310/336 |
| 4,184,094 | A * | 1/1980 | Kopel | 310/335 |
| 4,297,607 | A * | 10/1981 | Lynnworth et al. | 310/334 |
| 5,659,220 | A * | 8/1997 | Thurn et al. | 310/369 |
| 5,664,456 | A * | 9/1997 | Eckert | 73/290 V |
| 5,866,815 | A * | 2/1999 | Schwald et al. | 73/290 V |
| 2002/0000763 | A1* | 1/2002 | Jones | 310/337 |

FOREIGN PATENT DOCUMENTS

| | | | |
|---|---|---|---|
| DE | 43 23 134 | C1 | 6/1994 |
| DE | 43 11 963 | C2 | 10/1994 |
| DE | 4330745 | C1 | 4/1995 |

* cited by examiner

*Primary Examiner*—Thomas M. Dougherty
(74) *Attorney, Agent, or Firm*—Bacon & Thomas, PLLC

(57) ABSTRACT

A sound or ultrasound sensor having a radiation characteristic with a preferably small beam angle and producing very little interference signals, including a pot-shaped housing closed at its bottom end by a floor, a piezoelectric element for producing and/or receiving sound or ultrasound through the floor, a matching layer between the piezoelectric element and the floor, and a metal ring gripping around the matching layer with an interlocking fit.

5 Claims, 1 Drawing Sheet

SOUND OR ULTRASOUND SENSOR

FIELD OF THE INVENTION

The invention relates to a sound or ultrasound sensor for the transmission and/or reception of sound or ultrasound. Ultrasound sensors are e.g. used as transmitters and/or receivers for distance measurement based on the echo sounding principle, especially for measuring a fill level, e.g. in a container, or for measuring fill height, e.g. in a channel or on a conveyor belt.

BACKGROUND OF THE INVENTION

A pulse emitted from the sound or ultrasound sensor is reflected on the surface of the fill substance. The travel time of the pulse from the sensor to the surface and back is determined and from that the fill level, or fill height, is determined.

Such sound or ultrasound sensors are applied in many branches of industry, e.g. in the food industry, the water and wastewater sectors, and in chemicals.

In almost all areas of application, it is required that the sensors exhibit a radiation characteristic having a small beam angle for the main sound lobe and, at the same time, have small side lobes.

The beam angle of the sensor is essentially determined by the diameter of the front surface and the frequency. The sine of the beam angle of the radiated sound lobe equals the quotient of the wavelength of the radiated sound or ultrasound wave and the diameter of the front surface of the radiating element. Thus, to obtain a sound lobe of small beam angle, a large diameter needs to be used.

On the other hand, one achieves a good radiation characteristic with small side lobes by a bending shape of a radiating element, whose amplitude distribution corresponds approximately to a Gauss function and for which, additionally, the phase of the oscillation is the same over the entire surface. The larger the half-value width of this Gauss curve, the narrower the main lobe. It thus makes sense to produce an oscillation deflection shape, in which the available radiating surface is optimally utilized.

DE-C 42 33 365 discloses a sound or ultrasound sensor for transmission and/or reception of sound or ultrasound, having

- a piezoelectric element for producing and/or receiving sound or ultrasound through the floor,
- a matching layer between the piezoelectric element and the floor, and
- a metal ring gripping around the piezoelectric element with a force-transmitting, and interlocking, fit.

The ring and piezoelectric element thus form a unitary, oscillating, oscillation structure. In such case, therefore, the larger, outer diameter of the ring is used for calculating the beam angle of the sound lobe, and not the diameter of the piezoelectric element.

Additionally, it makes sense, also, to isolate sound or ultrasound oscillations from adjoining housing portions. On the one hand, in the case of a sympathetic oscillation of the housing wall, sound or ultrasound pulses can be transmitted from, and received by, the wall itself. This can lead to interference echoes. On the other hand, the sound or ultrasound can be transmitted as structure-borne sound to the housing and, from there, to a holder of the sensor and possibly even to further structural components at the location of use. This can likewise lead to significant interference signals.

SUMMARY OF THE INVENTION

It is an object of the invention to provide a sound or ultrasound sensor having a radiation characteristic with a preferably small beam angle and producing as little interference signals as possible.

To this end, the invention resides in a sound or ultrasound sensor for transmitting and/or receiving sound or ultrasound, having

- a pot-shaped housing closed below by a floor,
- a piezoelectric element for producing and/or receiving sound or ultrasound through the floor,
- a matching layer between the piezoelectric element and the floor, and
- a metal ring gripping around the matching layer and having an interlocking fit therewith.

In a further development, the matching layer has a groove extending annularly at, and around, its outer edge, on the floor-far side thereof.

In a further development, the groove has a depth, at which a coupling to the housing is small.

In one embodiment, a damping material is provided in the housing.

Advantages of the invention include that practically no transmission of sound, respectively ultrasound, to the housing is experienced. Corresponding interference signals thus are practically non-existent.

At the same time, the groove assures that an effective diameter of the radiating surface relevant for determining the beam angle of the radiation characteristic is nearly equal to the diameter of the matching layer. A floor side of the matching layer has an oscillation deflection shape corresponding to a Gauss line over almost the entire diameter. The beam angle is correspondingly small. A well bundled, targeted radiation occurs. The danger of stray signals and reflections, e.g. on walls of containers in which the sensor is installed, is, consequently, small.

The invention and further advantages will now be explained in greater detail on the basis of the figures of the drawing, in which an example of an embodiment is illustrated; equal elements are provided in the figures with equal reference characters.

DESCRIPTION OF THE PREFERRED EMBODIMENTS

Figure 1:
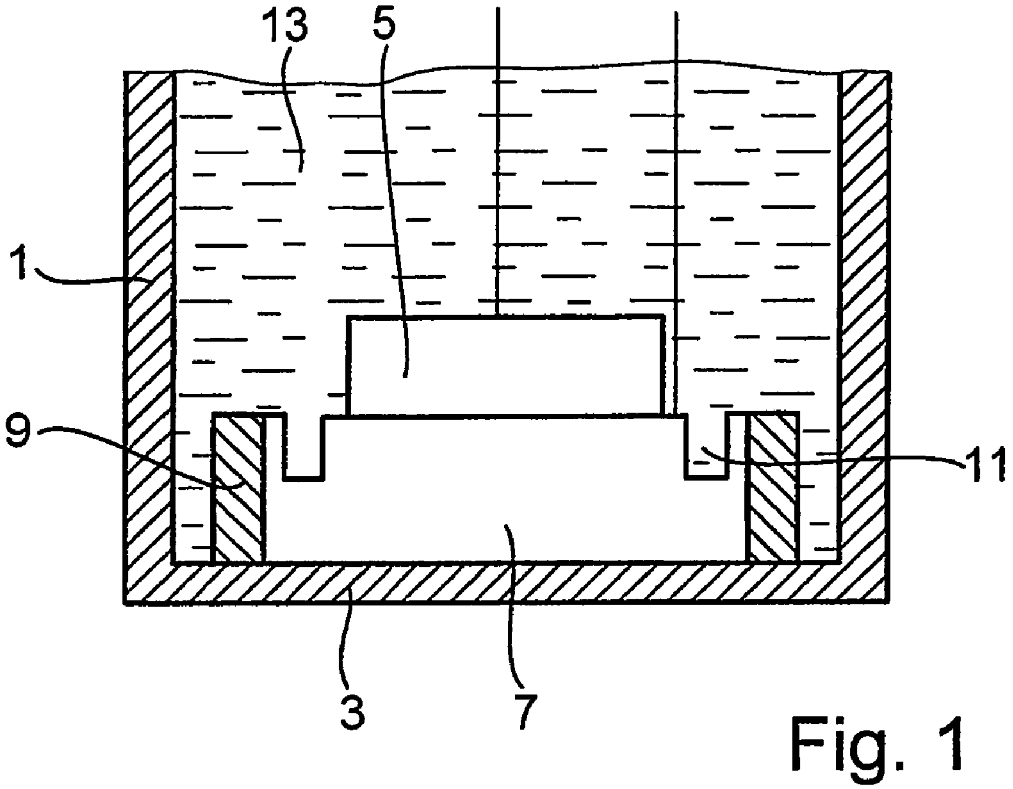
FIG. 1 shows a longitudinal section through a sound or ultrasound sensor.
Figure 2:
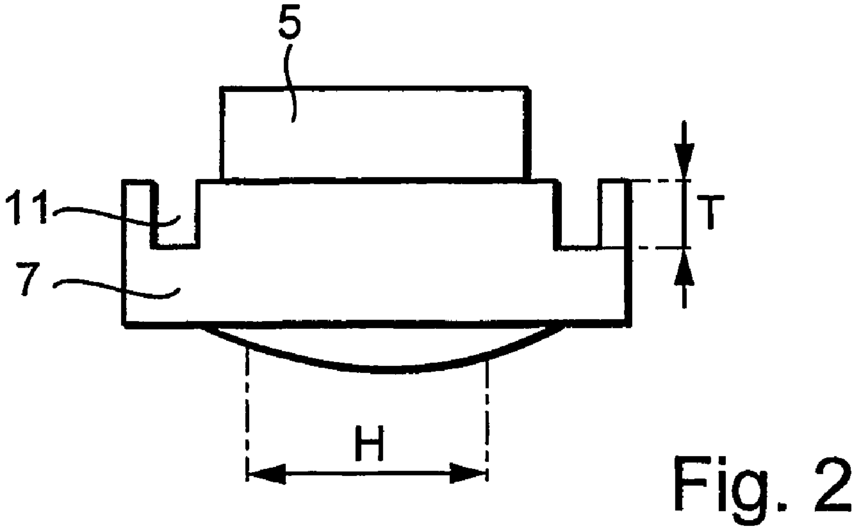
FIG. 2 shows a longitudinal section through the piezoelectric element and the matching layer of FIG. 1.

FIG. 1 shows a longitudinal section through a sound or ultrasound sensor of the invention for transmitting and/or receiving sound or ultrasound. FIG. 2 shows a longitudinal section through the piezoelectric element and the matching layer of FIG. 1.

The sound or ultrasound sensor has a pot-shaped housing 1, which is closed on the bottom by a floor 3. The housing 1 is made of a synthetic material, or plastic, such as e.g. polypropylene. Arranged in housing 1 is a piezoelectric element 5, which serves to produce and/or receive sound or ultrasound through the floor 3.

Since the acoustic impedance of the medium into which the sound or ultrasound is to be emitted, e.g. air, and that of the piezoelectric element 5 differ very strongly, a matching layer 7 of a synthetic material of intermediate acoustic impedance is arranged in front of the piezoelectric element 5. An example of a suitable synthetic material is epoxy resin. In the illustrated example of an embodiment, the piezoelectric element 5 is disk-shaped. The matching layer 7 is likewise disk-shaped and is located between the piezoelectric element 5 and the floor 3 of the housing 1.

In order to achieve as good a match as possible, and, thus, the highest possible sound pressure, the matching layer 7 has preferably a thickness corresponding to a quarter of the wavelength of the produced sound or ultrasound waves.

The matching layer 7 is surrounded by a metal ring 9, which grips around the matching layer 7 and has an interlocking fit therewith. The ring 9 is made e.g. of brass. It stabilizes the matching layer at its outer edge and practically blocks oscillations of the matching layer 7 from being transmitted to the housing 1.

Interferences that are transferred and/or transmitted by the housing in the case of conventional sensors are practically no longer noticeable in the case of the present invention.

A solid clamping of the matching layer 7 at its edge by the ring 9 does, however, prevent the matching layer 7 from deforming in an outer edge region thereof.

In order, nevertheless, to obtain the desired Gauss bending line with as great a half-value width as possible, the matching layer 7, therefore, preferably has a groove 11 extending annularly at, and around, its outer edge, on the floor-far side thereof. An outer, lateral bounding of the groove 11 can be, in this case, as shown in FIG. 1, a part of the matching layer 7. However, the ring 9 itself can also provide the outer, lateral bounding of the groove 11.

Investigations have shown that the half-value width of the radiating surface increases with increasing depth T of the groove. However, with respect to a coupling to the housing 1, the depth T does have an optimum value. The groove 11, therefore, preferably exhibits a maximum depth, at which a coupling to the housing 1 remains small.

The following is an example for the dimensions of the components of a sound or ultrasound sensor of the invention. In the case of a piezoelectric element 5 having a diameter of about 40 mm, the matching layer 7 has, for example, a diameter of about 50 mm and the groove 11 a width of, for example, 5 mm. An optimum depth of the groove 11 amounts, in this example of an embodiment, to about 5 mm.

In the case of a sound or ultrasound sensor, which is used, not as a transmitter, but, instead, as a receiver, it is important that transmission oscillation, once excited, rapidly decays. Only after a complete decay of the transmission oscillation is the sound or ultrasound sensor ready to receive. In order to achieve a rapid decay of the transmission oscillation, a damping material 13 is, therefore, preferably provided in the housing 1. The damping material 13 is e.g. a cast material, for instance a silicone gel, which fills the housing 1.

The invention claimed is:

1. A sound or ultrasound sensor for the transmission and/or reception of sound or ultrasound, comprising:

a pot-shaped housing closed at one end by a floor, a piezoelectric element for producing and/or receiving sound or ultrasound through said floor, a matching layer between said piezoelectric element and said floor; and a metal ring gripping around said matching layer and having an interlocking fit therewith, wherein:

said matching layer has a groove extending annularly at, and around, its outer edge, situated opposite to said floor.

2. The sound or ultrasound sensor as claimed in claim 1, wherein:

said groove has a depth (T), such that a coupling to said housing is small.

3. The sound or ultrasound sensor as claimed in claim 1, wherein:

a damping material is present in said housing.

4. The sound or ultrasound sensor as claimed in claim 1, wherein:

said metal ring extends the full thickness of said matching layer.

5. The sound or ultrasound sensor as claimed in claim 1, wherein:

said metal ring forms an outer edge of said groove.

* * * * *